(12) United States Patent
Rhyee et al.

(10) Patent No.: US 8,518,287 B2
(45) Date of Patent: Aug. 27, 2013

(54) DICHALCOGENIDE THERMOELECTRIC MATERIAL

(75) Inventors: Jong-soo Rhyee, Yongin-si (KR); Sang-mock Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 515 days.

(21) Appl. No.: 12/418,225

(22) Filed: Apr. 3, 2009

(65) Prior Publication Data
US 2009/0250651 A1 Oct. 8, 2009

(30) Foreign Application Priority Data

Apr. 4, 2008 (KR) .................. 10-2008-0031709
Jul. 21, 2008 (KR) .................. 10-2008-0070791

(51) Int. Cl.
*H01M 4/58* (2010.01)

(52) U.S. Cl.
USPC ........... 252/62.3 T; 136/238; 117/11; 117/13; 117/84; 117/81; 117/73; 423/263; 423/509; 423/561.1; 423/289; 423/297; 423/299; 423/344; 423/440

(58) Field of Classification Search
USPC ............... 252/62.3 T; 136/238; 117/11, 13, 117/84, 81, 73; 423/263, 509, 561.1, 289, 423/297, 299, 344, 440
See application file for complete search history.

(56) References Cited

U.S. PATENT DOCUMENTS

| | | | | |
|---|---|---|---|---|
| 3,197,410 A | * | 7/1965 | Brixner | 252/62.3 T |
| 3,223,640 A | * | 12/1965 | Brixner | 252/62.3 T |
| 3,306,857 A | * | 2/1967 | Brixner | 252/62.3 V |
| 3,372,997 A | * | 3/1968 | Bither, Jr. | 423/508 |
| 3,519,402 A | * | 7/1970 | Hulliger | 423/508 |
| 4,649,227 A | * | 3/1987 | Tributsch et al. | 136/252 |
| 5,039,626 A | * | 8/1991 | Koma et al. | 117/8 |
| 5,958,358 A | * | 9/1999 | Tenne et al. | 423/561.1 |
| 2003/0056819 A1 | | 3/2003 | Imai et al. | |
| 2007/0262408 A1 | * | 11/2007 | Takagi et al. | 257/467 |

FOREIGN PATENT DOCUMENTS

| | | | |
|---|---|---|---|
| EP | 1930960 | * | 6/2008 |
| JP | 2002-270907 A | | 9/2002 |
| JP | 2004288841 A | | 10/2004 |
| SU | 351276 | * | 11/1971 |

OTHER PUBLICATIONS

Chiritescu et al, "Ultralow Thermal Conductivity in Disordered. Layered WSe2 Crystals", Scince, vol. 319, Jan. 2007, pp. 351-353.*
Wang et al, "Sulfur Stoichiometry Effects in highly spin polarized CoS2 single crsytals", App. Phys. Lett, 88, 232509-1-3, Jun. 2006.*
Imai et al, "Large thermoselectric power factor in TiS2 crystal with nearly stiochoimetric composition", Phy. Rev. B, vol. 64, 24, Dec. 2001, 241104-1-4.*

(Continued)

*Primary Examiner* — Carol M Koslow
(74) *Attorney, Agent, or Firm* — Cantor Colburn LLP

(57) ABSTRACT

A dichalcogenide thermoelectric material having a very low thermal conductivity in comparison with a conventional metal or semiconductor is described. The dichalcogenide thermoelectric material has a structure of Formula 1 below:

$$RX_{2-a}Y_a \qquad \text{Formula 1}$$

wherein R is a rare earth or transition metal magnetic element, X and Y are each independently an element selected from the group consisting of S, Se, Te, P, As, Sb, Bi, C, Si, Ge, Sn, B, Al, Ga, In, and a combination thereof, and $0 \leq a < 2$.

10 Claims, 10 Drawing Sheets

(56) References Cited

OTHER PUBLICATIONS

Reid et al, "Eectrical Properties of Selected Rare Earth Compounds and Alloys", Journal of the Electrochemical Society, vol. III, No. 8, pp. 943-950, Aug. 1964.*

Bentien et al, "Experimetal and theoretical investigations of strongly correlated $FeSb_2-xSn_x$", Phys. Rev. B, 74, 205105, 2006.*

Chiritescu, C. et al., Ultralow Thermal Conductivity in Disordered, Layered $WSe_2$ Crystals, Science, Jan. 2007, 315: 351-353.

Imai, H. et al., Large thermoelectric power factor in $TiS_2$ crystal with nearly stoichiometric composition, Phys. Rev. B (2001);64, pp. 241104-1-4.

Qin, X.Y. et al., The effect of Mg substitution for Ti on transport and thermoelectric properties of $TiS_2$, J. of Applied Physics, vol. 102, Issue 7, pp. 073703-073703-7 (2007).

* cited by examiner

DICHALCOGENIDE THERMOELECTRIC MATERIAL

CROSS-REFERENCE TO RELATED PATENT APPLICATION

This application claims priority to Korean Patent Application No. 10-2008-0031709, filed on Apr. 4, 2008 and 10-2008-0070791, filed on Jul. 21, 2008, in the Korean Intellectual Property Office, and all the benefits accruing therefrom under 35 U.S.C. §119, the contents of which are both hereby incorporated in their entirety by reference.

BACKGROUND OF THE INVENTION

1. Field of the Invention

The present disclosure relates to a dichalcogenide thermoelectric material having a very low thermal conductivity in comparison with a conventional metal or semiconductor.

2. Description of the Related Art

In general, thermoelectric materials can be utilized in active cooling, waste heat power generation, and the like by using the Peltier effect and the Seebeck effect. FIG. 1 is a schematic diagram illustrating thermoelectric cooling using the Peltier effect. Referring to FIG. 1, the Peltier effect occurs when a DC voltage is applied and holes of a p-type material and electrons of an n-type material are transported, causing heat generation and heat absorption on both ends of the p-type and n-type materials. FIG. 2 is a schematic diagram illustrating thermoelectric power generation by the Seebeck effect. Referring to FIG. 2, the Seebeck effect occurs when heat is supplied from an external heat source and a flow of a current is generated in the material while electrons and holes are transported, resulting in power generation.

Active cooling with these thermoelectric materials improves the thermal stability of devices, does not cause vibration and noise, and does not use a separate condenser and refrigerant. Therefore, the volume of these devices is small and the active cooling method is environmentally friendly. Thus, active cooling that uses such thermoelectric materials can be applied in refrigerant-free refrigerators, air conditioners, microcooling systems, and the like. In particular, when a thermoelectric device is attached to a memory device, the temperature of the device can be maintained in a uniform and stable state, as compared to conventional cooling methods. Thus, the memory devices can have improved performance.

In addition, when thermoelectric materials are used in thermoelectric power generation using the Seebeck effect, waste heat can be used as an energy source. Thus, thermoelectric materials can be applied in a variety of fields that increase energy efficiency or reuse waste heat, such as in vehicle engines and air exhausts, waste incinerators, waste heat in iron mills, power sources of medical devices in the human body powered using human body heat, and the like.

As a factor for determining the performance of such thermoelectric materials, a dimensionless figure-of-merit ZT defined as Equation 1 below is used.

$$ZT = \frac{S^2 \sigma T}{k} \qquad \text{Equation 1}$$

wherein
S is a Seebeck coefficient,
σ is electrical conductivity,
T is absolute temperature, and
κ is thermal conductivity.

To increase the performance of such thermoelectric materials, the values of the dimensionless figure-of-merit ZT should increase. Accordingly, there is a need to develop a material having a high Seebeck coefficient and electrical conductivity and low thermal conductivity.

Many kinds of thermoelectric materials have been developed. However, many thermoelectric materials perform well only in a range of room temperature to high temperature. For example, $Bi_2Te_3$ and a solid solution compound thereof are known thermoelectric materials having high performance at about room temperature (300 to 400 degrees Kelvin ("K")).

However, there is a need to develop a variety of thermoelectric materials that perform well over broader temperature ranges. For this, there is an increasing interest in thermoelectric materials having a dichalcogenide structure.

For example, U.S. Patent Publication No. US2003/0056819 and Japanese Patent Laid-Open Publication No. P2002-270907 by NEC, Japan disclose a conventional dichalcogenide thermoelectric material having a two-dimensional layered structure. The thermoelectric material is represented by Formula $A_xBC_{2-y}$ where $0 \leq x \leq 2$ and $0 \leq y < 1$, wherein A comprises at least one element selected from the group consisting of Li, Na, K, Rb, Cs, Mg, Ca, Sr, Ba, Ti, V, Cr, Mn, Fe, Co, Ni, Cu, Zn, Zr, Nb, Mo, Ru, Rh, Pd, Ag, Cd, Hf, Ta, W, Re, Ir, Pt, Au, Sc, Y, and a rare earth element, B comprises at least one element selected from the group consisting of Ti, V, Cr, Zr, Nb, Mo, Hf, Ta, W, Ir, and Sn, and C comprises one of S, Se, and Te. In Examples disclosed in these NEC applications, thermoelectric characteristics of an $A_xTiS_2$ material are described, and ZT values are reported to be very high, i.e., 2.9 at room temperature, 3.9 at 700 K, and the like. However, there appear to be no references that verify these ZT values in any subsequently reported materials, and in fact, ZT values of $A_xTiS_2$ are reported to be no more than 0.2 at room temperature (see Phys. Rev. B, vol. 64, 241104, 2001 and J. Appl. Phys., vol. 102, 073703, 2007). Accordingly, the thermoelectric material disclosed in this application is not in wide use.

In addition, in 2007, Catalin Chiritescu et al. manufactured a $WSe_2$ thin film having a very low thermal conductivity (see Science, vol. 315, p. 351, 2007). $WSe_2$ having a two-dimensional layered structure can have very low thermal conductivity, i.e., about 0.05 Watts per meter-Kelvin ("$Wm^{-1}K^{-1}$") when thin films are stacked irregularly in an in-plane direction and regularly in a c-axis direction. This means that materials having a 2-dimensional disordered and layered structure within the in-plane direction, but regularly stacked in the c-axis direction can have a very low thermal conductivity. However, such thermoelectric materials, which are insulators, have very low electrical conductivity, and thus are unsuitable for use as a thermoelectric material. In addition, it is difficult to make materials with random arrangement in an in-plane direction in bulk.

SUMMARY OF THE INVENTION

The present disclosure provides a dichalcogenide thermoelectric material having a very low thermal conductivity and a large power factor compared to a conventional metal or semiconductor.

According to an aspect of the present disclosure, there is provided a dichalcogenide thermoelectric material having a structure of Formula 1 below:

$$RX_{2-a}Y_a \qquad \text{Formula 1}$$

wherein

R is a rare earth or transition metal magnetic element,

X and Y are each independently at least one element selected from the group consisting of S, Se, Te, P, As, Sb, Bi, C, Si, Ge, Sn, B, Al, Ga, and In, and $0 \leq a < 2$.

In one embodiment, R is at least one element selected from the group consisting of a lanthanide rare earth element, Mn, Fe, Co, Ni, Cu, Zn, and Ag.

In another embodiment, X is S, Se, or Te. A combination comprising at least one of S, Se, and Te can also be used.

The dichalcogenide thermoelectric material can have a thermal conductivity of $2 \text{ Wm}^{-1}\text{K}^{-1}$ or less at room temperature.

According to another aspect of the present disclosure, there is provided a dichalcogenide thermoelectric material that has a two-dimensional layered structure with irregular arrangement in an in-plane direction, and has a structure of Formula 1 below:

$$RX_{2-a}Y_a \qquad \text{Formula 1}$$

wherein

R is a rare earth or transition metal magnetic element,

X and Y are each independently at least one element selected from the group consisting of S, Se, Te, P, As, Sb, Bi, C, Si, Ge, Sn, B, Al, Ga, and In, and $0 \leq a < 2$.

The layered structure can have a structure in which X and R are alternately arranged between layers. Further, X can be in the form of a single layer, a double layer, or a triple layer. Optionally, a portion of X is substituted with Y.

A covalent bond can be formed in an in-plane direction, and at least one of an ionic bond and a Van der Waals bond can be formed between layers.

According to another aspect of this disclosure, there is provided a compound represented by Formula 1 below:

$$RX_{2-a}Y_a \qquad \text{Formula 1}$$

wherein

R is a rare earth or transition metal magnetic element,

X and Y are each independently at least one element selected from the group consisting of S, Se, Te, P, As, Sb, Bi, C, Si, Ge, Sn, B, Al, Ga, and In, and $0 \leq a < 2$.

BRIEF DESCRIPTION OF THE DRAWINGS

As those skilled in the art would realize, the described embodiments may be modified in various different ways, all without departing from the spirit or scope of the invention. The above and other features and advantages of the present disclosure will become more apparent by describing in detail exemplary embodiments thereof with reference to the attached drawings in which.

DETAILED DESCRIPTION OF THE INVENTION

Figure 1:
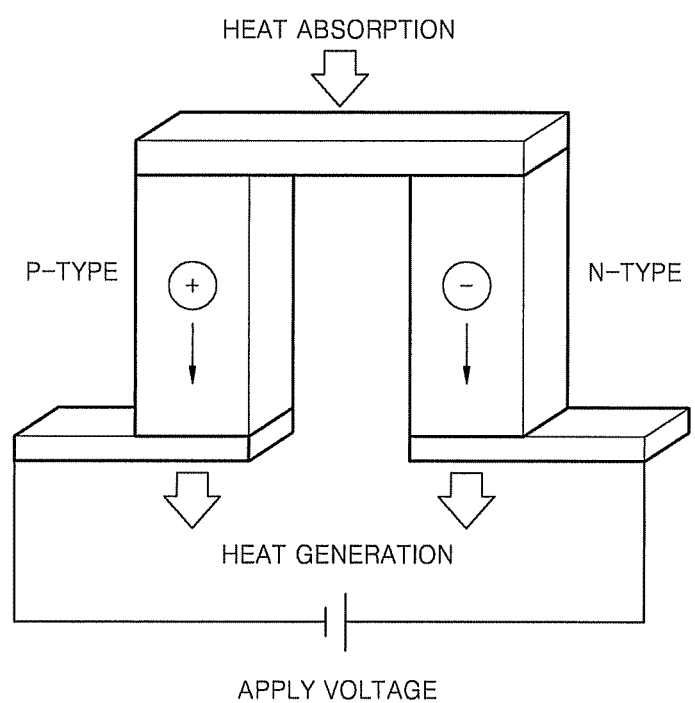
FIG. 1 is a schematic diagram illustrating thermoelectric cooling using the Peltier effect.
Figure 2:
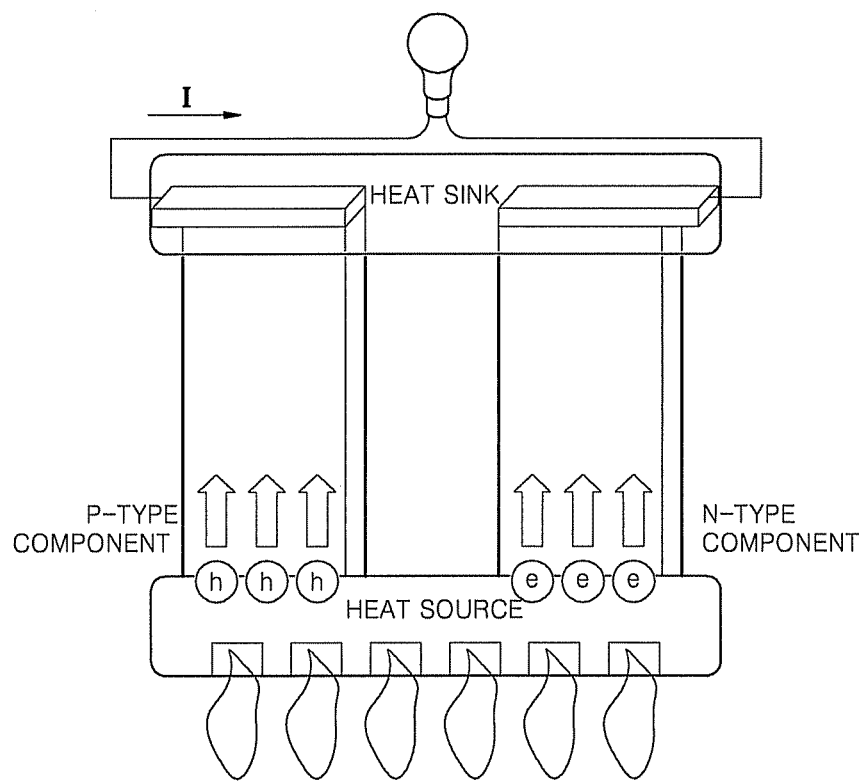
FIG. 2 is a schematic diagram illustrating thermoelectric power generation utilizing the Seebeck effect.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure provides a dichalcogenide thermoelectric material having a structure of Formula 1 below:

$$RX_{2-a}Y_a \qquad \text{Formula 1}$$

wherein

R is a rare earth or transition metal magnetic element,

X and Y are each independently at least one element selected from the group consisting of S, Se, Te, P, As, Sb, Bi, C, Si, Ge, Sn, B, Al, Ga, and In, and $0 \leq a < 2$.

The dichalcogenide thermoelectric material of Formula 1 according to the present disclosure has a 2-dimensional layered structure, has an irregular crystalline structure in an in-plane direction, and is crystalline in the direction of a c-axis, and as a result, has a low thermal conductivity. In particular, Y is utilized as a doping element and is selectively added to the primary component $RX_2$, thereby improving electrical conductivity. Accordingly, a value ZT of Equation 1 below is increased, $$ZT = \frac{S^2 \sigma T}{k} \qquad \text{Equation 1}$$

wherein

S refers to the Seebeck coefficient,

σ refers to electrical conductivity,

T refers to absolute temperature, and

κ is thermal conductivity.

R in the dichalcogenide thermoelectric material of Formula 1 represents a rare earth and/or a transition metal magnetic element. For example, the rare earth and/or transition metal magnetic element can be at least one element selected from the group consisting of a lanthanide rare earth element, Mn, Fe, Co, Ni, Cu, Zn, and Ag. The lanthanide rare earth element can be Ce.

In the dichalcogenide thermoelectric material of Formula 1, X forms a primary structure, that is, a 2-dimensional layered structure together with R. For example, X can be at least one element selected from the group consisting of S, Se, Te, P, As, Sb, Bi, C, Si, Ge, Sn, B, Al, Ga, and In, and in particular, X can be S, Se, or Te, or a combination thereof.

R and X form a covalent bond with each other to provide a primary structure of $RX_{2-a}Y_a$ wherein a is an actual number ranging from 0 to less than 2. Y as a doping element is selectively added to optimize current density of the dichalcogenide thermoelectric material.

Figure 3:
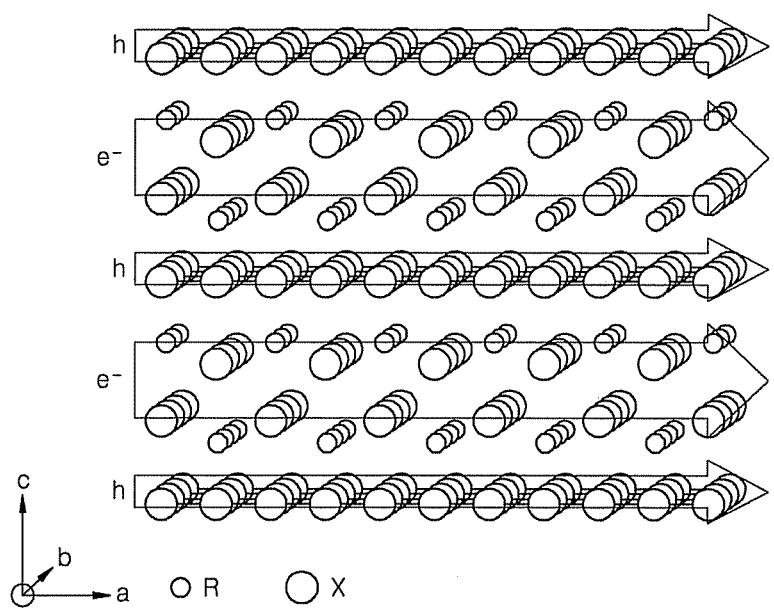
FIG. 3 illustrates a 2-demensional layered structure of an $RX_a$ or $RX_{2-a}Y_a$ compound, according to an exemplary embodiment of the present disclosure.

The dichalcogenide thermoelectric material having the primary structure of $RX_{2-a}Y_a$ can have a 2-dimensional layered structure. The 2-dimensional layered structure, as illustrated in FIG. 3, has a structure in which R and X are alternately arranged between layers formed of X. This structure is an irregular crystalline structure in an in-plane direction, and is crystalline in the direction of a c-axis.

In addition, this structure has layers formed of X with strong covalent bonds in an in-plane direction, and weak ionic bonds or weak Van der Waals bonds formed in a c-axis direction. In this type of structure, the transfer of phonons in the c-axis direction is difficult, resulting in low thermal conductivity in the c-axis direction. In particular, this structure shows irregular arrangement with respect to a direction perpendicular to the in-plane direction, and thus has optimum conditions for low thermal conductivity.

In general, thermal conductivity $k_{tot}$ represented by the equation $k_{tot}=k_{Latt}+k_{el}$ can be divided into thermal conductivity by lattice $k_{Latt}$ and thermal conductivity by electrons $k_{el}$. The electron thermal conductivity is determined according to the Wiedemann-Frantz law as given in Equation 2 below, and thus it is not a factor that can be artificially decreased. Thus, a good-quality thermoelectric material should have low lattice thermal conductivity, which can be obtained by control of a lattice structure.

$$K_{el}=LT\sigma \quad \text{Equation 2}$$

In Equation 2,

T is absolute temperature,

σ is electrical conductivity, and

L=2.44×10$^{-8}$ ΩW/K$^2$ (the Lorentz factor), wherein

Ω is ohms,

W is watts, and

K is degrees Kelvin.

A synthesis method of the dichalcogenide thermoelectric material having the formula of $RX_a$ is divided into polycrystalline synthesis and single crystal growth.

1. Polycrystalline Synthesis (1) Ampoule method: this method involves adding a material element to an ampoule made of a quartz tube or a metal such as tungsten or tantalum, sealing the ampoule in a vacuum, and heat treating the ampoule for several to several tens of hours (e.g., 3 to 50 hours) at a temperature equal to, above, or about a melting point of the material element.

(2) Arc melting method: this method involves adding a material element to a chamber, discharging an arc in an inert gas atmosphere to dissolve the material element resulting in the formation of a sample.

(3) Solid state reaction method: this method involves mixing a solid powder of the material and then heat treating the resultant material for several to several tens of hours (e.g., 3 to 50 hours) at a temperature in a range of 70 to 90% of the melting point of the material, or heat treating the mixed powder for several to several tens of hours (e.g., 3 to 50 hours) at a temperature equal to or above the melting point, and then pulverizing the resultant material at room temperature and sintering the pulverized resultant material for several to several tens of hours (e.g., 3 to 50 hours) at a temperature in a range of 70 to 90% of a melting point of the material.

2. Single Crystal Growth (1) Metal flux method: this method involves first adding a material element and an element to a furnace. The element can be, for example, a metal element that congruently melts and has a lower melting point than a melting point of the desired crystal. The element provides an atmosphere so that the material element can grow satisfactorily into a crystal at a high temperature in the furnace. Next, the resultant material is slowly cooled from a temperature that the metal element congruently melts to a temperature that the metal element forms a crystal. For example, a rate of 1 to 10° C./hour can be used to grow a crystal.

(2) Bridgeman method: this method involves adding a material element to a furnace, heating the material element at a high temperature, for several to several tens of hours (e.g., 3 to 50 hours) at a temperature equal to or above a melting point of the material element, until the material element is melted. The melted material element is slowly moved in a heated region, for example at a rate of 0.5 to about 10° C./hour, by creating a temperature difference between both end portions of the furnace of several to several tens of degrees Celsius (e.g., 3 to 50° C.), such that the material element passes through a crystal growing area resulting in crystal formation.

(3) Floating zone method: this method involves preparing a material element in the form of a seed rod and a feed rod, converging light of a lamp on the feed rod to locally melt the material element, and then slowly moving a region to be irradiated to melt the material element to grow a crystal.

(4) Vapor transport method: this method involves placing a material element into a bottom portion of a quartz tube, heating the bottom portion containing the material element for several to several tens of hours (e.g., 3 to 50 hours) at an evaporation temperature, and maintaining a top portion of the quartz tube at a low temperature to induce a solid state reaction at the low temperature while the material element is evaporated, thereby growing a crystal.

The dichalcogenide thermoelectric material of the present disclosure can be prepared using any one of the various methods described above.

The dichalcogenide thermoelectric material prepared using the methods described above can be additionally doped with an element, thereby providing optimized current density. As a result, two-band conduction where electrons and holes co-exist can occur. In this case, two-band conduction can be eliminated by substitution of the metal element, which can have only electron or hole conduction characteristics. This provides for dichalcogenide thermoelectric material with a large power factor and a very low thermal conductivity.

When doped with an element, the dichalcogenide thermoelectric material necessarily includes Y as a doping element, and accordingly, has optimized current density, resulting in increased electrical conductivity. This increases the power factor $S^2\sigma$ of Equation 1, thereby increasing the value of ZT.

That is, an X site is substituted with the doping element Y, and thus the current density of either holes or electrons is increased. As a result, a compensation effect by electrons and holes can be prevented, and thus the Seebeck coefficient can be improved. Due to the improved conduction characteristics, the power factor $S^2\sigma$ is increased, thereby increasing the Seebeck coefficient.

The doping component Y can be at least one selected from the group consisting of S, Se, Te, P, As, Sb, Bi, C, Si, Ge, Sn, B, Al, Ga, and In, and specifically can beat least one element selected from the group consisting of P, As, Sb, Bi, C, Si, Ge, Sn, B, Al, Ga, and In. The amount of the component Y can be less than 2 moles based on 1 mole of R of Formula 1.

The doping element Y can be added in the form of one component, two components, or three components. In the case of two components, a molar ratio thereof can be in the range of 1:9 to 9:1. In the case of three components, a molar ratio thereof can be in the range of 1:0.1-9.0:0.1-9.0. However, the present disclosure is not limited thereto.

A part of component X of the primary structure $RX_{2-a}Y_a$ is substituted with the component Y in the doping process, and as a result, current density is optimized. The doping process can be performed by adding component Y as a part of the material element in the polycrystalline synthesis or single crystal growth process.

The dichalcogenide thermoelectric material of the present disclosure has a low thermal conductivity. At the same time, electrons or holes are injected due to the additional doping treatment to improve compensation between the Seebeck coefficients of electrons and holes. Thus, the Seebeck coefficient is increased and current density is optimized, thereby improving electrical conductivity. Accordingly, the dichalcogenide thermoelectric material can have a high thermoelectric performance.

Hereinafter, the present disclosure will be described more specifically with reference to the following examples. The following examples are for illustrative purposes only and are not intended to limit the scope of the claims.

EXAMPLE 1

A polycrystalline thermoelectric material was synthesized by the ampoule method using an ampoule. First, Ce, Te, and Sn as material elements were quantified in a predetermined ratio and added to an ampoule made of a quartz tube. Then, the ampoule with the material element was sealed in a vacuum and heat treated at 850° C. for 24 hours to respectively synthesize rare earth dichalcogenide $CeTe_2$, $CeTe_{1.95}Sn_{0.05}$, $CeTe_{1.9}Sn_{0.1}$, $CeTe_{1.7}Sn_{0.3}$, $CeTe_{1.5}Sn_{0.5}$, and CeTeSn. Mole ratios of $CeTe_2$, $CeTe_{1.95}Sn_{0.05}$, $CeTe_{1.9}Sn_{0.1}$, $CeTe_{1.7}Sn_{0.3}$, $CeTe_{1.5}Sn_{0.5}$, and CeTeSn are checked by using an inductively coupled plasma spectroscopy.

$CeTe_2$ has a two-dimensional layered structure, and a weak ionic bond between a Te layer and a Ce—Te block is formed. $CeTe_{2-x}Sn_x$ has a structure in which Sn is doped to substitute a part of Te in $CeTe_2$.

EXAMPLE 2

A polycrystalline thermoelectric material was synthesized by the ampoule method. First, Ce, Se, and Sn as material elements were quantified in a predetermined ratio and added to an ampoule made of a quartz tube. Then, the ampoule with the material element was sealed in a vacuum and heat treated at 850° C. for 24 hours to respectively synthesize rare earth dichalcogenide $CeSe_2$, $CeSe_{1.9}Sn_{0.1}$, $CeSe_{1.8}Sn_{0.2}$, and $CeSe_{1.5}Sn_{0.5}$. Mole ratios of $CeSe_2$, $CeSe_{1.9}Sn_{0.1}$, $CeSe_{1.8}Sn_{0.2}$, and $CeSe_{1.5}Sn_{0.5}$ are checked by using an inductively coupled plasma spectroscopy.

Figure 4:
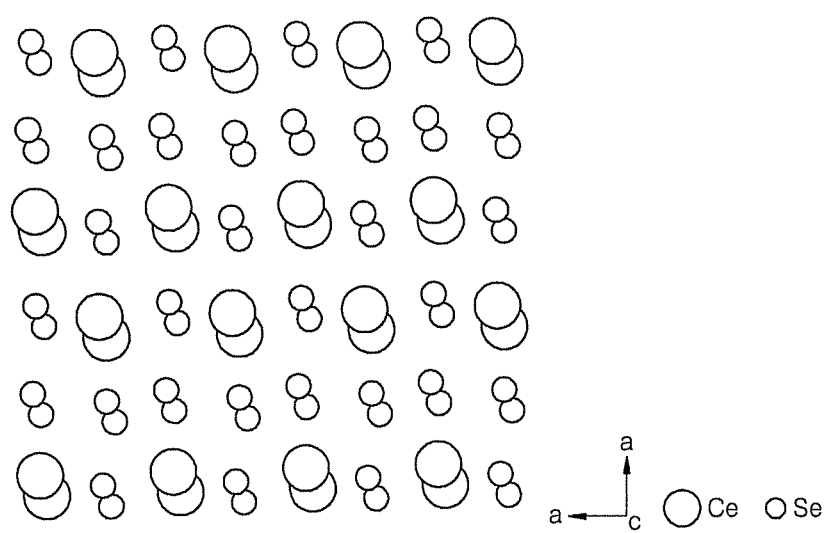
FIG. 4 illustrates a 2-demensional layered structure of a $CeSe_2$ compound, according to an exemplary embodiment of the present disclosure.

$CeTe_2$ has a flat orthorhombic structure in a direction of b-axis as illustrated in FIG. 4, and has a two-dimensional layered structure, and a weak ionic bond between a Se layer and a Ce—Se block is formed. $CeTe_{2-x}Sn_x$ has a structure in which Sn is doped to substitute a part of Se in $CeSe_2$.

EXPERIMENTAL EXAMPLE 1

Measurement of Thermal Conductivity

Figure 5:
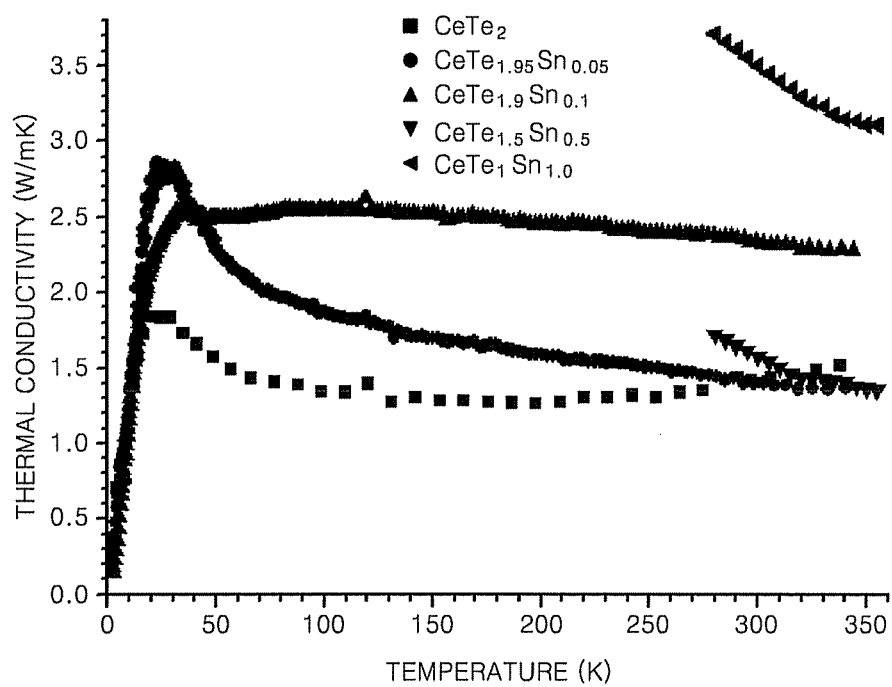
FIG. 5 is a graph showing thermal conductivity of an exemplary $CeTe_{2-x}Sn_x$ ($x \leq 1.0$) as obtained in Example 1.

Thermal conductivities of $CeTe_2$, $CeTe_{1.95}Sn_{0.05}$, $CeTe_{1.95}Sn_{0.1}$, $CeTe_{1.5}Sn_{0.5}$, and CeTeSn prepared in Example 1 are illustrated in FIG. 5, and the thermal conductivities are measured by measuring thermal relaxation via a laser flash method. As illustrated in FIG. 5, $CeTe_2$, $CeTe_{1.95}Sn_{0.05}$, $CeTe_{1.95}Sn_{0.1}$, $CeTe_{1.5}Sn_{0.5}$, and CeTeSn have very low thermal conductivities, and specifically, $CeTe_2$ and $CeTe_{1.95}Sn_{0.05}$ have very low thermal conductivities in a range of about 1.50 to about 1.58 $Wm^{-1}K^{-1}$ at 300 K. In addition, the conductivity values of $CeTe_2$ and $CeTe_{1.95}Sn_{0.05}$ are approximately 55% lower than commercially available Sb-doped $Bi_2Te_3$, and is significantly lower than other thermoelectric materials. When a mole ratio x of Sn in $CeTe_{2-x}Sn_x$ is equal to or above 1.0, thermal conductivity increases, and thus performance decreases. Thermal conductivities of $CeTe_2$ and $CeTe_{0.5}Sn_{0.5}$ are compared with those of other commercially available thermoelectric materials in Table 1 below

TABLE 1

| | $K_{tot}$ ($Wm^{-1}K^{-1}$) | $k_{el}$ ($Wm^{-1}K^{-1}$) | $k_{latt}$ ($Wm^{-1}K^{-1}$) |
|---|---|---|---|
| $Bi_2Te_3$ | 2.9 | 1.6 | 1.3 |
| $Bi_2Te_3$ ($Sb_2Te_3$ 33.3 mole %) | 2.5 | 1.6 | 0.9 |
| $Bi_2Te_3$ ($Sb_2Te_3$ 66.7 mole %) | 2.8 | 2.2 | 0.6 |
| $CeTe_2$ | 1.40 | 0.09 | 1.31 |
| $CeTe_{1.5}Sn_{0.5}$ | 1.36 | 0.37 | 0.99 |

As shown in Table 1, lattice thermal conductivities of $CeTe_2$ and $CeTe_{0.5}Sn_{0.5}$ are similar to those of the commercially available thermoelectric materials, but $CeTe_2$ and $CeTe_{1.5}Sn_{0.5}$ have a low electron thermal conductivity. Consequently, thermal conductivities of $CeTe_2$ and $CeTe_{1.5}Sn_{0.5}$ are very low, i.e., in the range of 2.0 or less.

Figure 6:
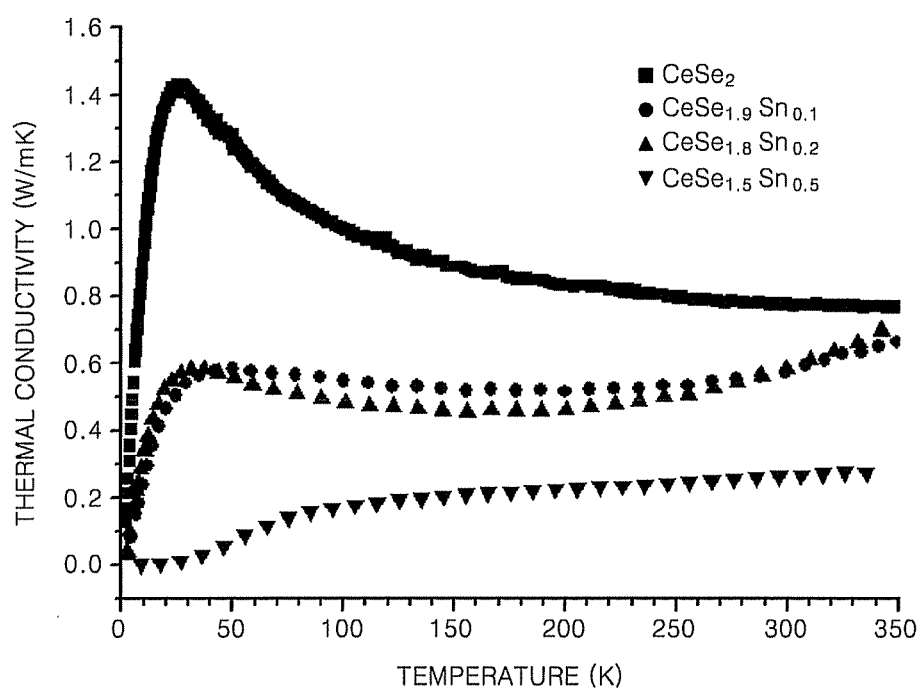
FIG. 6 is a graph showing thermal conductivity of an exemplary $CeSe_{2-x}Sn_x$ ($x \leq 0.5$) as obtained in Example 2.

Thermal conductivities of $CeSe_2$, $CeSe_{1.9}Sn_{0.1}$, $CeSe_{1.8}Sn_{0.2}$, and $CeSe_{1.5}Sn_{0.5}$ prepared in Example 2 are illustrated in FIG. 6, and the thermal conductivities are measured by measuring thermal relaxation via a laser flash method. As illustrated in FIG. 6, $CeSe_2$, $CeSe_{1.9}Sn_{0.1}$, $CeSe_{1.8}Sn_{0.2}$, and $CeSe_{1.5}Sn_{0.5}$ have very low thermal conductivities, and specifically, as the amount of Sn, which is a doping component, increases, thermal conductivity decreases. Accordingly, the thermal conductivity of $CeSe_{1.5}Sn_{0.5}$ is 0.2 $Wm^{-1}K^{-1}$.

EXPERIMENTAL EXAMPLE 2

Measurement of Seebeck Coefficient

Figure 7:
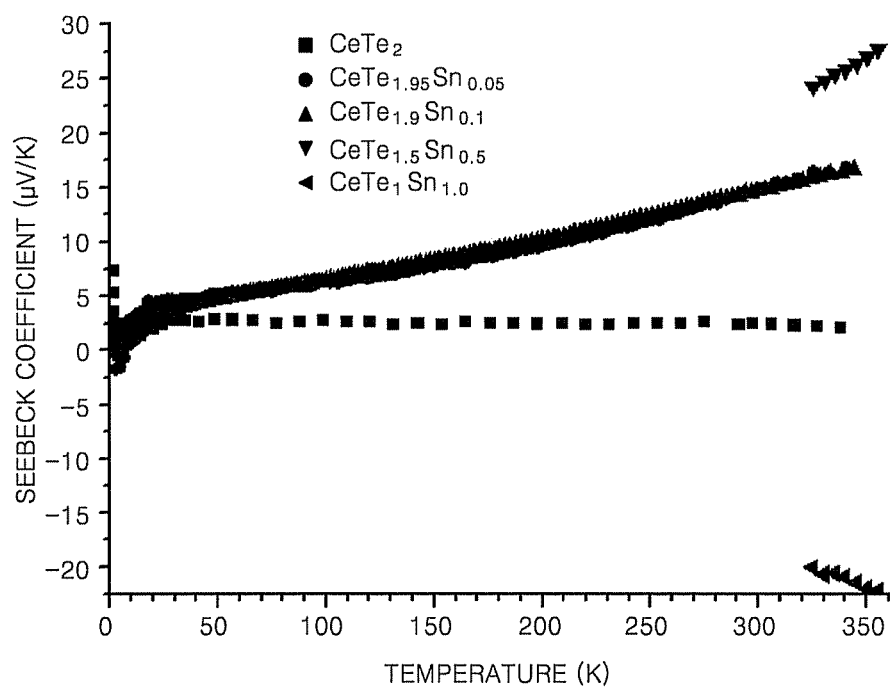
FIG. 7 is a graph showing a value of a Seebeck coefficient of the exemplary $CeTe_{2-x}Sn_x$ ($x \leq 1.0$) obtained in Example 1.

Seebeck coefficients of $CeTe_2$, $CeTe_{1.95}Sn_{0.05}$, $CeTe_{1.9}Sn_{0.1}$, $CeTe_{1.5}Sn_{0.5}$, and CeTeSn prepared in Example 1 are illustrated in FIG. 7. The Seebeck coefficients are measured via a 4-terminal method. As illustrated in FIG. 7, an absolute value of a Seebeck coefficient increased when Te is substituted with Sn in $CeTe_2$. $CeTe_2$ has a small gap semiconductor structure in which electrons and holes co-exist, and holes move in a Te layer and electrons move in a Ce—Te block. Thus, conduction characteristics in a c-axis direction are deteriorated, resulting in a compensation effect between electrons and holes. Due to this, the Seebeck coefficient can be decreased. Therefore, there is a need to increase the Seebeck coefficient. Accordingly, in the case of $CeTe_{1.95}Sn_{0.05}$, $CeTe_{1.9}Sn_{0.1}$, $CeTe_{1.5}Sn_{0.5}$, and CeTeSn in which a part of Te is substituted with Sn, the Seebeck coefficient is increased by controlling a carrier in a Te layer. That is, a Te site is substituted with Sn, thereby adjusting current density of electrons and holes, and accordingly, the Seebeck coefficient is increased.

Figure 8:
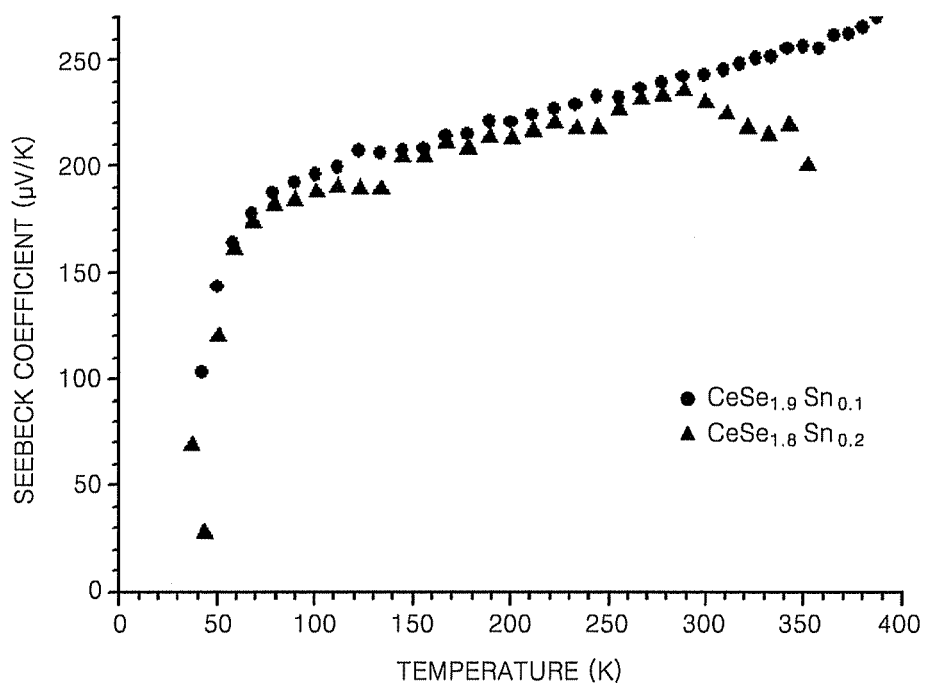
FIG. 8 is a graph showing a value of a Seebeck coefficient of the exemplary $CeSe_{2-x}Sn_x$ ($x \leq 0.5$) obtained in Example 2.

Seebeck coefficients of $CeSe_{1.9}Sn_{0.1}$ and $CeSe_{1.8}Sn_{0.2}$ prepared in Example 2 are illustrated in FIG. 8. As illustrated in FIG. 8, when Se is substituted with Sn, the Seebeck coefficients are increased by adjusting a carrier of a Se layer. Accordingly, $CeSe_{1.9}Sn_{0.1}$ and $CeSe_{1.8}Sn_{0.2}$ have high Seebeck coefficients.

EXPERIMENTAL EXAMPLE 3

Measurement of Values of Electric Resistance

Figure 9:
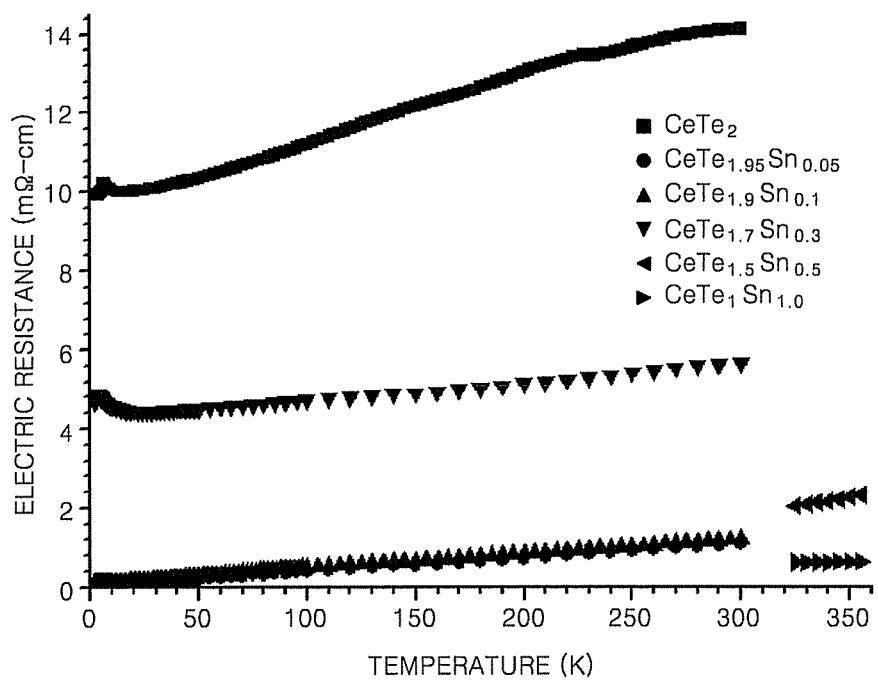
FIG. 9 is a graph showing a value of electric resistance of $CeTe_{2-x}Sn_x$ ($x \leq 1.0$) obtained in Example 1.

Electric resistance of $CeTe_2$, $CeTe_{1.95}Sn_{0.05}$, $CeTe_{1.9}Sn_{0.1}$, $CeTe_{1.7}Sn_{0.3}$, $CeTe_{1.5}Sn_{0.5}$, and CeTeSn prepared in Example 1 is measured and illustrated in FIG. 9. The electric resistance is measured via a 4-terminal method. As illustrated in FIG. 9, $CeTe_{1.5}Sn_{0.5}$ in which $CeTe_2$ having an electric resistance of about 10 milliohm-centimeter ("mΩ-cm") is doped with Sn has an electric resistance of 2 mΩ-cm.

A value of electric resistance according to a temperature can change by a doping process. Here, electric resistance decreases since the number of holes is increased by substituting Te sites with Sn, which is a doping element.

Figure 10:
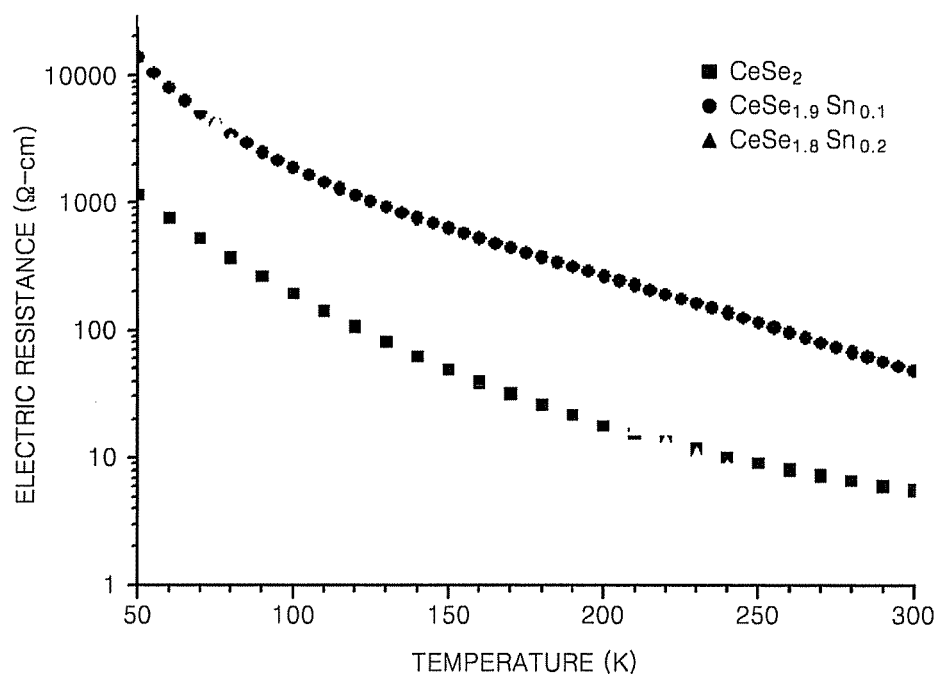
FIG. 10 is a graph showing a value of electric resistance of $CeSe_{2-x}Sn_x$ ($x \leq 0.5$) obtained in Example 2.

Electric resistance of $CeSe_2$, $CeSe_{1.9}Sn_{0.1}$, and $CeSe_{1.8}Sn_{0.2}$ prepared in Example 2 is measured and illustrated in FIG. 10. The electric resistance is measured via a 4-terminal method. As illustrated in FIG. 10, $CeSe_2$, $CeSe_{1.9}Sn_{0.1}$, and $CeSe_{1.8}Sn_{0.2}$ have very high electric resistance.

Thus, electric resistance is reduced by element doping, thereby improving electrical conductivity. As a result, it is seen that the value of the Seebeck coefficient can be increased, resulting in increasing the power factor.

The dichalcogenide thermoelectric material according to the present disclosure has a large power factor and a very low thermal conductivity, and thus can be used in refrigerant-free refrigerators, air conditioners, waste heat power generation, thermoelectric nuclear power generation for military and aerospace, microcooling systems, and the like.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A composition comprising a dichalcogenide thermoelectric material having a two-dimensional layered structure with an irregular arrangement in an in-plane direction, wherein the thermoelectric material is of Formula 1:

$$RX_{2-a}Y_a \qquad \text{Formula 1}$$

wherein
R is at least one element selected from the group consisting of a rare earth element, Mn, Fe, Co, Cu, Zn, and Ag
X is at least one element selected from the group consisting of S, Se, and Te,
Y is at least one element selected from the group consisting of S, Se, Te, P, As, Bi, C, Si, Ge, Sn, B, Al, Ga, and In, $0<a<2$, and
X and Y are different from each other.

2. The composition of claim 1, wherein the layered structure has a structure in which X and R are alternately arranged between layers comprising X in the form of a single layer, a double layer, or a triple layer.

3. The composition of claim 1, wherein a covalent bond is formed in an in-plane direction, and at least one of an ionic bond and a Van der Waals bond is formed between layers.

4. A method of producing the composition of claim 1, the method comprising synthesizing the dichalcogenide thermoelectric material by a polycrystalline synthesis method or a single crystal growth method.

5. The method of claim 4, wherein the dichalcogenide thermoelectric material is synthesized by the polycrystalline synthesis method and wherein the polycrystalline synthesis method is selected from the group consisting of an ampoule method, an arc melting method, and a solid state reaction method.

6. The method of claim 4, wherein the dichalcogenide thermoelectric material is synthesized by the single crystal growth method and wherein the single crystal growth method is selected from the group consisting of a metal flux method, a Bridgeman method, an optical floating zone method, and a vapor transport method.

7. The composition of claim 1, wherein R is at least one element selected from the group consisting of a lanthanide rare earth element, Mn, Fe, Co, Cu, Zn, and Ag.

8. The composition of claim 7, wherein the lanthanide rare earth element is Ce.

9. The composition of claim 1, wherein $0<a<1$.

10. The composition of claim 1, having a thermal conductivity of 2 Wm−1K−1 or less at room temperature.

* * * * *